US009865550B2

(12) United States Patent
Chan (10) Patent No.: US 9,865,550 B2
(45) Date of Patent: Jan. 9, 2018

(54) PATTERN GENERATOR HAVING STACKED CHIPS

(71) Applicant: TAIWAN SEMICONDUCTOR MANUFACTURING COMPANY, LTD., Hsinchu (TW)

(72) Inventor: Hao-Chieh Chan, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 76 days.

(21) Appl. No.: 14/086,100

(22) Filed: Nov. 21, 2013

(65) Prior Publication Data

US 2015/0137324 A1    May 21, 2015

(51) Int. Cl.
| | |
|---|---|
| *H01L 23/538* | (2006.01) |
| *H01L 23/498* | (2006.01) |
| *H01L 23/00* | (2006.01) |
| *G06F 1/32* | (2006.01) |
| *H01L 25/065* | (2006.01) |
| *H01L 25/18* | (2006.01) |
| *H01L 23/48* | (2006.01) |

(52) U.S. Cl.
CPC ............ *H01L 23/5386* (2013.01); *G06F 1/32* (2013.01); *H01L 23/49816* (2013.01); *H01L 23/5384* (2013.01); *H01L 23/5385* (2013.01); *H01L 24/82* (2013.01); *H01L 25/0657* (2013.01); *H01L 23/481* (2013.01); *H01L 24/05* (2013.01); *H01L 24/06* (2013.01); *H01L 24/16* (2013.01); *H01L 24/17* (2013.01); *H01L 25/18* (2013.01); *H01L 2224/0401* (2013.01); *H01L 2224/0557* (2013.01); *H01L 2224/06181* (2013.01); *H01L 2224/16145* (2013.01); *H01L 2224/17181* (2013.01); *H01L 2225/06513* (2013.01); *H01L 2225/06541* (2013.01); *H01L 2924/10252* (2013.01); *H01L 2924/10253* (2013.01); *H01L 2924/10271* (2013.01); *H01L 2924/10272* (2013.01); *H01L 2924/10329* (2013.01); *H01L 2924/10331* (2013.01); *H01L 2924/10332* (2013.01); *H01L 2924/10333* (2013.01); *H01L 2924/10335* (2013.01); *H01L 2924/37001* (2013.01)

(58) Field of Classification Search
CPC . H01L 25/0652; H01L 23/5384; H01L 24/82; H01L 23/5385; H01L 23/5386; H01L 23/49816
See application file for complete search history.

(56) References Cited

U.S. PATENT DOCUMENTS

7,494,846 B2 *  2/2009  Hsu .......................... G11C 5/02
                                                                    257/E21.513
7,755,061 B2    7/2010  Grella et al.
(Continued)

*Primary Examiner* — Michael Jung
(74) *Attorney, Agent, or Firm* — Hauptman Ham, LLP (57) ABSTRACT

A pattern generator includes and upper chip and one or more lower chips. The upper chip includes an upper substrate and a plurality of conductive plates on the upper substrate. The plurality of conductive plates is arranged as an array. The one or more lower chips include one or more lower substrates and a plurality of driving circuits each on one of the one or more lower substrates and electrically coupled with a corresponding one of the plurality of conductive plates. The upper chip and the one or more lower chips are stacked one over another.

20 Claims, 4 Drawing Sheets

(56) References Cited

U.S. PATENT DOCUMENTS

| | | | |
|---|---|---|---|
| 2010/0254191 A1* | 10/2010 | Son | H01L 27/0207 365/185.05 |
| 2011/0079924 A1* | 4/2011 | Suh | G11C 5/00 257/777 |
| 2011/0291265 A1* | 12/2011 | Jin | H01L 23/481 257/737 |
| 2012/0038057 A1* | 2/2012 | Bartley | H01L 23/3677 257/774 |
| 2012/0195090 A1* | 8/2012 | Hayashi | G11C 5/063 365/63 |
| 2012/0254472 A1* | 10/2012 | Ware | G11C 5/02 710/3 |
| 2013/0169059 A1* | 7/2013 | Sun | H04B 5/0037 307/104 |
| 2013/0277852 A1* | 10/2013 | Chen | H01L 21/6835 257/774 |
| 2013/0293292 A1* | 11/2013 | Droege | H01L 25/0657 327/565 |
| 2013/0307159 A1* | 11/2013 | Safran | H01L 23/481 257/774 |
| 2014/0091478 A1* | 4/2014 | Furuta | H01L 23/481 257/774 |

* cited by examiner

PATTERN GENERATOR HAVING STACKED CHIPS

BACKGROUND

Technological advances in integrated circuit (IC) materials and design have produced generations of ICs where each generation has smaller and more complex circuits than the previous generation. However, these advances have increased the complexity of processing and manufacturing ICs and, for these advances to be realized, similar developments in IC processing and manufacturing are needed. For example, lithography processes, such as photo lithography, optical lithography, or electron beam (e-beam) lithography, are used for patterning a layer of resistive material. The patterned layer of resistive material is usable for a subsequent etching or doping process.

DESCRIPTION OF THE DRAWINGS

One or more embodiments are illustrated by way of example, and not by limitation, in the figures of the accompanying drawings, wherein elements having the same reference numeral designations represent like elements throughout.

DETAILED DESCRIPTION

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

Moreover, spatially relative terms, for example, "lower," "upper," "horizontal," "vertical," "above," "below," "up," "down," "top," "bottom," "left," "right," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

In some embodiments, e-beam lithography uses a focused beam of electrons to directly react with a layer of energy-sensitive resist material without using a mask. In some embodiments, the focused beam of electrons is arranged to have high-energy portions and low-energy portions together defining a pattern of predetermined resolution. A pattern generator includes an array of conductive plates each having an adjustable reflective characteristic against an incident electron beam. The pattern of the focused beam of electrons is generated by reflecting an incident electron beams by using the pattern generator.

In some embodiments using e-beam lithography, the critical dimension of resulting patterns formed on the resistive material is in proportion to a size of conductive plates of a pattern generator. By having an upper chip for the array of conductive plates and one or more lower chips for corresponding driving circuits, a size of the conductive plates is only limited by a fabrication process for forming the conductive plates. Compared with a pattern generator that has all driving circuit and the array of conductive plates in a single chip, the separation of a chip for conductive plates and one or more chips for driving circuits also helps to increase the flexibility with regard to power consumption design and routing for the driving circuits. In some embodiments, the pattern generator is fabricated using an applicable complementary metal-oxide semiconductor (CMOS) stacking technology.

Figure 1:
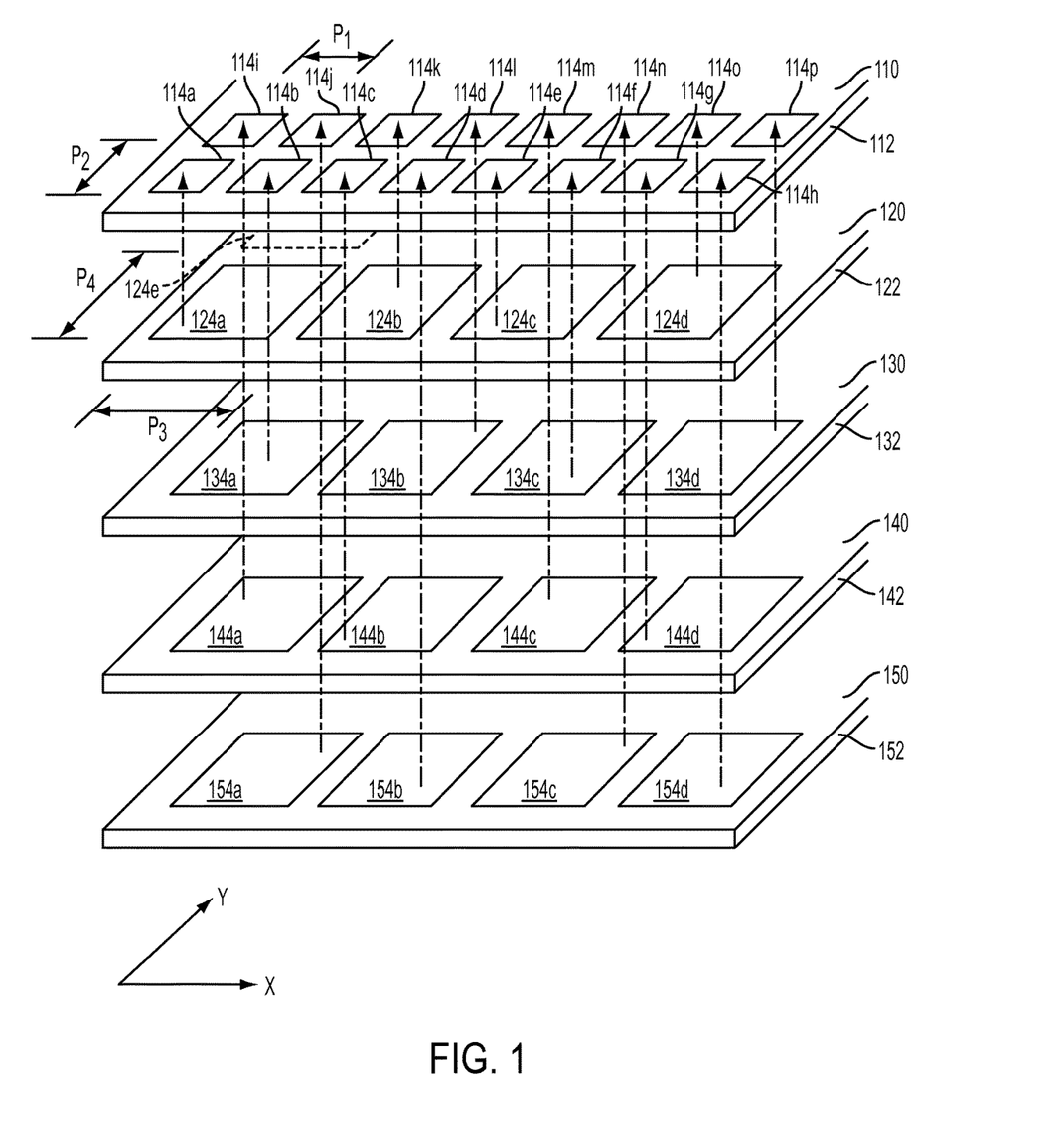
FIG. 1 is a perspective view of a portion of a floor plan of a pattern generator in accordance with one or more embodiments.

FIG. 1 is a perspective view of a portion of a floor plan 100 of a pattern generator in accordance with one or more embodiments. The floor plan 100 includes floor plans for various chips and components thereon of the pattern generator. To facilitate the understanding of the disclosed embodiments, elements in the floor plan 100 will be referred to by the physical components they represent.

The pattern generator (as represented by the floor plan 100) includes an upper chip 110 and one or more lower chips 120, 130, 140, and 150. The physical chips 110, 120, 130, 140, and 150 are stacked one over another using applicable three-dimensional integrated circuit technology. In some embodiments, each of the physical chips 110, 120, 130, 140, and 150 are fabricated using a CMOS fabrication process, and the physical chips 110, 120, 130, 140, and 150 are stacked together using an applicable CMOS stacking technology.

Upper chip 110 includes a substrate 112 and a plurality of conductive plates 114a-114p on substrate 112. The plurality of conductive plates 114a-114p is arranged as an array of conductive plates. For a predetermined manufacturing process used to fabricate chip 110, the plurality of conductive plates 114a-114p is associated with a threshold pitch P1 along the X direction and a threshold pitch P2 along the Y direction. The threshold pitches P1 and P2 are the minimum placement spacing a conductive plate needs with respect to a neighboring component along corresponding directions without deteriorating a yield rate of manufacturing the upper chip 110 according to the predetermined manufacturing process. As depicted in FIG. 1, pitch P3 is measurable as a pitch between conductive plates 114a and 114b along the X direction, and pitch P2 is measurable as a pitch between conductive plates 114a and 114i along the Y direction. In some embodiments, an actual pitch between two adjacent conductive plates is equal to or greater than the corresponding threshold pitches P1 and P2. In some embodiments, threshold pitches P1 and P2 range from 10 nanometer (nm) to 1 micrometer (μm).

Lower chips 120, 130, 140, and 150 each include a substrate 122, 132, 142, and 152 and a plurality of driving circuits 124a to 124d, 134a to 134d, 144a to 144d, and 154a to 154d on corresponding substrates. The plurality of driving circuits 124a to 124d, 134a to 134d, 144a to 144d, and 154a to 154d is electrically coupled with a corresponding one of the plurality of conductive plates 114a to 114p (as indicated by dashed arrows). As depicted in FIG. 1, driving circuit 124a is electrically coupled with conductive plate 114a, driving circuit 124b is electrically coupled with conductive plate 114k, driving circuit 124c is electrically coupled with conductive plate 114e, and driving circuit 124d is electrically coupled with conductive plate 114o. As depicted in FIG. 1, driving circuits 134a to 134d are electrically coupled with conductive plates 114b, 114l, 114f, and 114p; driving circuits 144a to 144d are electrically coupled with conductive plates 114i, 114c, 114m, and 114g; and driving circuits 154a to 154d are electrically coupled with conductive plates 114j, 114d, 114n, and 114h.

Driving circuits 124a to 124d, 134a to 134d, 144a to 144d, and 154a to 154d are configured to output voltage signals in response to a set of input data. Conductive plates 114a to 114p thus in turn have voltage levels of a corresponding one of the voltage signals from driving circuits 124a to 124d, 134a to 134d, 144a to 144d, and 154a to 154d. In some embodiments, the lower the voltage level at the conductive plate, the higher the reflectivity against electrons. A size and resolution of the plurality of conductive plates 114a to 114p also determines a size and resolution of the pattern at the reflected electron beam. In some embodiments, voltage signals of driving circuits 124a to 124d, 134a to 134d, 144a to 144d, and 154a to 154d has either a logic high voltage level or a logic low voltage level. In some embodiments, the logic high voltage level is greater than the logic low voltage level by a predetermined voltage difference ranging from 1.8 V to 3.3V.

For a predetermined manufacturing process used to fabricate chips 120, 130, 140, or 150, driving circuits 124a to 124d, 134a to 134d, 144a to 144d, and 154a to 154d are associated with a corresponding threshold pitch P3 along the X direction and a corresponding threshold pitch P4 along the Y direction. For example, pitch P3 is measurable as a pitch between driving circuit 124a and driving circuit 124b along the X direction, and pitch P4 is measurable as a pitch between driving circuit 124a and a reference space 124b suitable for placing another driving circuit along the Y direction. The threshold pitches P3 and P4 are the minimum placement spacing a driving circuit needs with respect to a neighboring component along the corresponding directions without deteriorating a yield rate of manufacturing the lower chips 120, 130, 140, or 150 according to the predetermined manufacturing process. In some embodiments, the actual placement spacing between two adjacent driving circuits is equal to or greater than the corresponding threshold pitches P3 and P4. In some embodiments, threshold pitch P3 or P4 is greater than threshold pitch P1 or P2. In some embodiments, threshold pitches P3 and P4 range from 0.8 μm to 1.5 μm.

In some embodiments, lower substrate 122 of lower chip 120 has an area sufficient to accommodate all driving circuits for driving all the conductive plates on chip 110, and thus chips 130, 140, and 150 are omitted. In some embodiments, each of the lower substrate 122, 132, 142, and 152 has an area insufficient to accommodate all of the driving circuits for driving all the conductive plates on chip 110. Thus, there are more or less than four lower chips for accommodating driving circuits for conductive plates 114a to 114p. In some embodiments, the number of lower chips is determined based on various factors including a size of a conductive plate, a size of a driving circuit, a space on each lower chip for forming circuits other than driving circuits, a space on each lower chip for electrically connecting other lower chips to upper chip 110, etc. In some embodiments, each of lower substrate 122, 132, 142, and 152 has an area substantially the same as that of upper substrate 112.

In some embodiments, threshold pitch P3 is about M times of threshold pitch P1, M is a positive integer, and the lower chips comprises at least M chips for accommodating driving circuits. Moreover, in some embodiments, threshold pitch P4 is about N times of threshold pitch P2, N is a positive integer, and the lower chips comprises at least M×N chips for accommodating driving circuits. For example, if threshold pitch P3 is about twice threshold pitch P1 (M=2) and threshold pitch P4 is about twice threshold pitch P2 (N=2), the pattern generator has at least four (M×N=4) lower chips for driving circuits. In at least one embodiment, if threshold pitch P3 is about the same as threshold pitch P1 (M=1) and threshold pitch P4 is about the same as threshold pitch P2 (N=1), the pattern generator has at least one (M×N=1) lower chip for placing all driving circuits.

In some embodiments, each of the lower chips 120, 130, 140, and 150 has about the same number of driving circuits. In some embodiments, lower chips 120, 130, 140, and 150 have different numbers of driving circuits in order to accommodate other circuits and/or interconnection structures.

Figure 2:
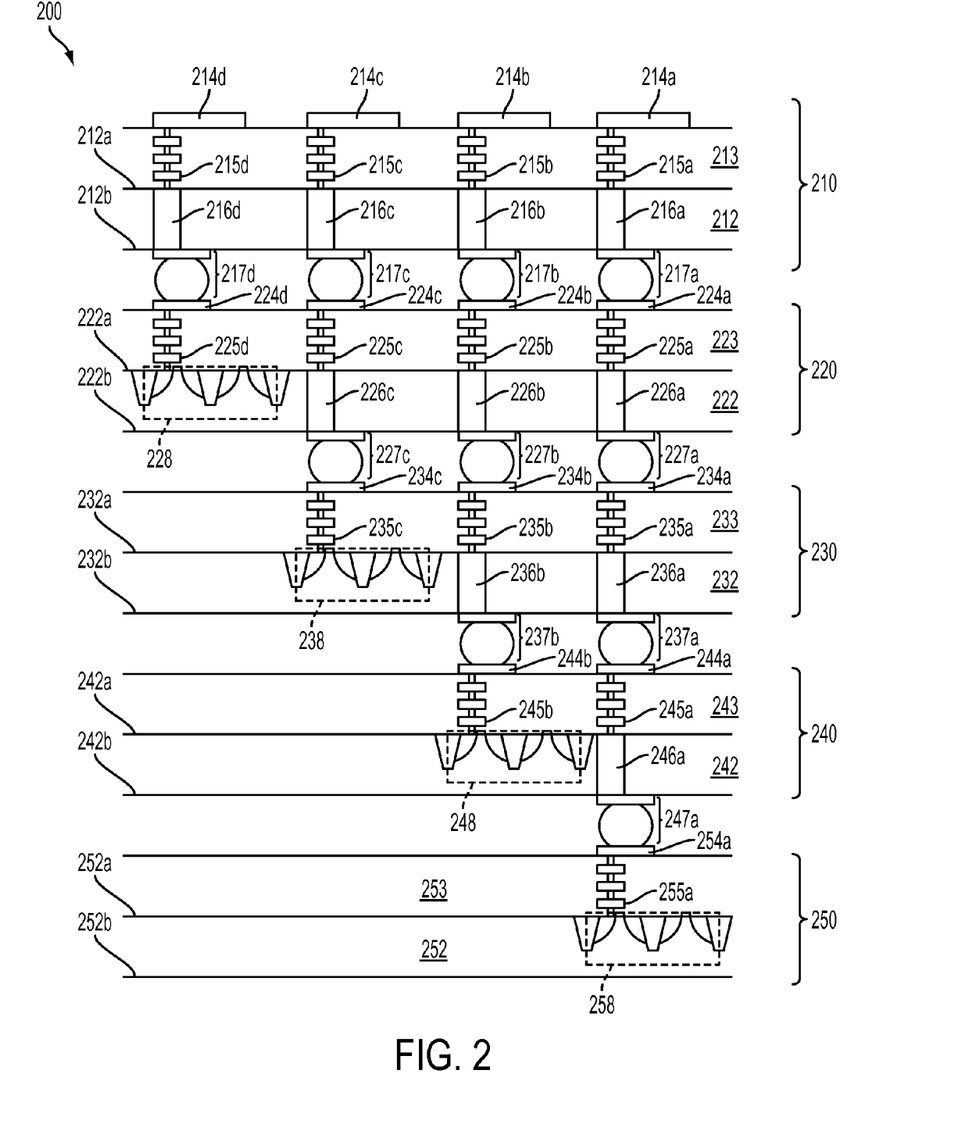
FIG. 2 is a cross-sectional view of a portion of a pattern generator in accordance with one or more embodiments.

FIG. 2 is a cross-sectional view of a portion of a pattern generator 200 in accordance with one or more embodiments. Pattern generator 200 includes an upper chip 210 and one or more lower chips 220, 230, 240, and 250. The upper chip 210 and lower chips 220, 230, 240, and 250 are fabricated based on the floor plan 100 depicted in FIG. 1 for upper chip 110 and lower chips 120, 130, 140, and 150. In some embodiments, there are more or less than four lower chips mounted with an upper chip.

Upper chip 210 includes a substrate 212 having an upper surface 212a and a lower surface 212b, an interconnection structure 213 over the upper surface 212a, and a set of conductive plates 214a to 214d arranged as an array over interconnection structure 213 and upper surface 212a. Interconnection structure 213 includes a set of conductive paths 215a to 215d formed by various conductive lines and via plugs. Upper chip 210 further includes a set of via plugs 216a to 216d extending through the substrate 213 and a set of bump structures 217a to 217d. In some embodiments, via plugs 216a to 216d are through substrate vias (TSVs). In some embodiments, via plugs 216a to 216d are inter layer vias (ILVs) or inter device vias (IDVs). Each via plug of the set of via plugs 216a to 216d is electrically coupled to a corresponding one of conductive plates 214a to 214d through corresponding conductive paths 215a to 215d. Each bump structure of the set of bump structures 217a to 217d is electrically coupled to a corresponding one of the set of via plugs 216a to 216d. In some embodiments, via plugs 216a to 216d are electrically connected to corresponding conductive paths 215a to 215d without passing through bump structures 217a to 217d and conductive pads 224a to 224d.

Although only four conductive plates 214a to 214d and corresponding via plugs 216a to 216d are depicted in FIG. 2, in some embodiments, there are more or less than four conductive plates 214a to 214d and corresponding via plugs 216a to 216d. Also, in some embodiments, the numbers of various conductive pads, via plugs, bump structures, and paths are not limited by the number of example components depicted in the partial cross-sectional view of pattern generator 200.

In some embodiments, substrate 212 comprises an elementary semiconductor, a compound semiconductor, an alloy semiconductor, or a combination thereof. Examples of the elementary semiconductor include, but are not limited to, silicon and germanium. Examples of a compound semiconductor include, but are not limited to, silicon carbide, gallium arsenic, gallium phosphide, indium phosphide, indium arsenide, or indium antimonide. Examples of the alloy semiconductor include, but are not limited to, SiGe, GaAsP, AlInAs, AlGaAs, GaInAs, GaInP, or GaInAsP. Other semiconductor materials including group III, group IV, and group V elements are used in some embodiments. In one or more embodiments, substrate 212 comprises a semiconductor on insulator (SOI), a doped epitaxial layer, a gradient semiconductor layer, and/or a stacked semiconductor structure with one semiconductor layer (e.g., Si) overlying another semiconductor layer (e.g., Ge) of a different type. In some embodiments, substrate 212 comprises a P-type doped substrate. Examples of P-type dopants in the P-doped substrate include, but are not limited to, boron, gallium, or indium.

Lower chip 220 includes a substrate 222 having an upper surface 222a and a lower surface 222b, an interconnection structure 223 over the upper surface 222a, and a set of conductive pads 224a to 224d over interconnection structure 223. Substrate 212 is mounted on substrate 222 through the set of bump structures 217a to 217d and conductive pads 224a to 224d. Interconnection structure 223 includes a set of conductive paths 225a to 225d formed by various conductive lines and via plugs. Lower chip 220 further includes a set of via plugs 226a to 226c extending through the substrate 223 and a set of bump structures 227a to 227c. In some embodiments, via plugs 226a to 226c are through substrate vias (TSVs). In some embodiments, via plugs 226a to 226c are inter layer vias (ILVs) or inter device vias (IDVs). Each via plug of the set of via plugs 226a to 226c is electrically coupled to a corresponding one of conductive pads 224a to 224c through corresponding conductive paths 225a to 225c, which in turn are electrically coupled to a corresponding one of the set of bump structures 217a to 217c. Each bump structure of the set of bump structures 227a to 227c is electrically coupled to a corresponding one of the set of via plugs 226a to 226c. In some embodiments, via plugs 226a to 226c are electrically connected to corresponding conductive paths 225a to 225c without passing through bump structures 227a to 227c and conductive pads 234a to 234c.

Moreover, lower chip 220 further includes one or more driving circuits 228 on the upper surface 222a of the substrate 222. Driving circuits 228 includes active and/or passive electrical components configured to bias corresponding conductive plates on upper substrate 212. Each of the driving circuits 228 is electrically coupled with a corresponding one the set of bump structures 217d, which in turn is electrically coupled to a corresponding conductive plate 214d. Compared with floor plan 100 with respect to chip 110 and chip 120, driving circuit 228 corresponds to the driving circuit 124a, and conductive plate 214d corresponds to the conductive plate 114a.

Lower chips 230, 240, and 250 have similar configuration as that of lower chips 220. In some embodiments, lower chip 220 is sufficient to accommodate all driving circuits for all conductive plates on upper substrate 212, and thus lower chips 230, 240, and 250 are omitted. In some embodiments, there are more or less than four lower chips in a pattern generator.

Lower chip 230 includes a substrate 232 having an upper surface 232a and a lower surface 232b, an interconnection structure 233 over the upper surface 232a, and a set of conductive pads 234a to 234c over interconnection structure 233. Substrate 222 is mounted on substrate 232 through the set of bump structures 227a to 227c and conductive pads 234a to 234c. In some embodiments, substrate 222 is mounted on substrate 232 using one or more layers or adhesive materials or molding materials. Interconnection structure 233 includes a set of conductive paths 235a to 235c formed by various conductive lines and via plugs. Lower chip 230 further includes a set of via plugs 236a and 236b extending through the substrate 233 and a set of bump structures 237a and 237b. In some embodiments, via plugs 236a and 236b are through substrate vias (TSVs). In some embodiments, via plugs 236a and 236b are inter layer vias (ILVs) or inter device vias (IDVs). Each via plug of the set of via plugs 236a and 236b is electrically coupled to a corresponding one of conductive pads 234a and 234b through corresponding conductive paths 235a and 235b, which in turn is electrically coupled to a corresponding one of the set of bump structures 227a and 227b. Each bump structure of the set of bump structures 237a and 237b is electrically coupled to a corresponding one of the set of via plugs 236a and 236b. In some embodiments, via plugs 236a and 236b are electrically connected to corresponding conductive paths 235a and 235b without passing through bump structures 237a and 237b and conductive pads 244a and 244b.

Moreover, lower chip 230 further includes one or more driving circuits 238 on the upper surface 232a of the substrate 232. Driving circuits 238 includes active and/or passive electrical components configured to bias corresponding conductive plates on upper substrate 212. Each of the driving circuits 238 is electrically coupled with a corresponding one the set of bump structures 227c, which in turn is electrically coupled to a corresponding conductive plate 214c. Compared with floor plan 100 with respect to chip 110 and chip 130, driving circuit 238 corresponds to the driving circuit 134a, and conductive plate 214c corresponds to the conductive plate 114b.

Lower chip 240 includes a substrate 242 having an upper surface 242a and a lower surface 242b, an interconnection structure 243 over the upper surface 242a, and a set of conductive pads 244a and 244b over interconnection structure 243. Substrate 232 is mounted on substrate 242 through the set of bump structures 237a and 237b and conductive pads 244a and 244b. In some embodiments, substrate 232 is mounted on substrate 242 using one or more layers or adhesive materials or molding materials. Interconnection structure 243 includes a set of conductive paths 245a and 245b formed by various conductive lines and via plugs. Lower chip 240 further includes a set of via plugs, such as via plug 246a, extending through the substrate 243 and a set of bump structures, such as bump structure 247a. In some embodiments, via plug 246a is a through substrate via (TSV). In some embodiments, via plug 246a is an inter layer via (ILV) or inter device via (IDVs). Each via plug of the set of via plugs 246a is electrically coupled to a corresponding one of conductive pads 244a through corresponding conductive paths 245a, which in turn are electrically coupled to a corresponding one of the set of bump structures 237a. Each bump structure of the set of bump structures 247a is electrically coupled to a corresponding one of the set of via plugs 246a. In some embodiments, via plug 246a is electrically connected to corresponding conductive path 245a without passing through bump structure 247a and conductive pad 254a.

Moreover, lower chip 240 further includes one or more driving circuits 248 on the upper surface 242a of the substrate 242. Driving circuits 248 includes active and/or passive electrical components configured to bias corresponding conductive plates on upper substrate 212. Each of the driving circuits 248 is electrically coupled with a corresponding one the set of bump structures 237b, which in turn is electrically coupled to a corresponding conductive plate 214b. Compared with floor plan 100 with respect to chip 110 and chip 140, driving circuit 248 corresponds to the driving circuit 144c, and conductive plate 214b corresponds to the conductive plate 114c.

Lower chip 250 includes a substrate 252 having an upper surface 252a and a lower surface 252b, an interconnection structure 253 over the upper surface 252a, and a set of conductive pads, such as conductive pad 254a, over interconnection structure 253. Substrate 242 is mounted on substrate 252 through the set of bump structures 247a and conductive pads 254a. In some embodiments, substrate 242 is mounted on substrate 252 using one or more layers or adhesive materials or molding materials. Interconnection structure 253 includes a set of conductive paths, such as conductive path 255a, formed by various conductive lines and via plugs.

Moreover, lower chip 250 includes one or more driving circuits 258 on the upper surface 252a of the substrate 252. Driving circuits 258 includes active and/or passive electrical components configured to bias corresponding conductive plates on upper substrate 212. Each of the driving circuits 258 is electrically coupled with a corresponding one the set of bump structures 247a, which in turn is electrically coupled to a corresponding conductive plate 214a. Compared with floor plan 100 with respect to chip 110 and chip 150, driving circuit 258 corresponds to the driving circuit 144d, and conductive plate 214a corresponds to the conductive plate 114d.

In some embodiments, upper chip 210 and lower chips 220, 230, and 240 are fabricated by similar fabrication process and having similar materials. In some embodiments, upper chip 210 and lower chips 220, 230, and 240 are fabricated by a suitable CMOS fabrication process. In some embodiments, upper chip 210 and lower chips 220, 230, and 240 are fabricated by different fabrication processes.

Figure 3:
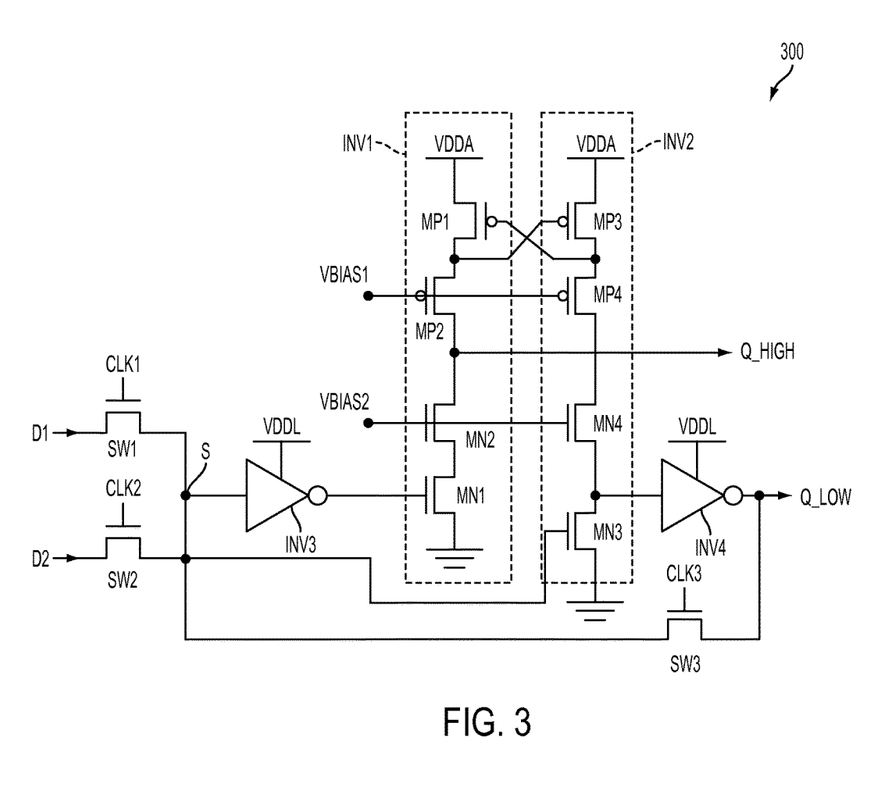
FIG. 3 is a schematic diagram of a driving circuit in accordance with one or more embodiments.

FIG. 3 is a schematic diagram of a driving circuit 300 in accordance with one or more embodiments. Driving circuit 300 is usable as driving circuits 124a to 124d, 134a to 134d, 144a to 144d, and 154a to 154d depicted in FIG. 1 and driving circuits 228, 238, 248, and 258 depicted in FIG. 2.

Driving circuit 300 includes inverters INV1, INV2, INV3, and INV4, and switches SW1, SW2, and SW3 configured as a flip-flop circuit with built-in level shifting functionality. Inverters INV1 and INV2 are inverters with built-in level shifting functionality. Therefore, inverters INV1 and INV2 are capable of receiving input signals transitioning between a ground and a first logic high level VDDL and generating output signals transitioning between the ground and a second logic high level VDDA greater than the first logic high level VDDL. Inverters INV3 and INV4 and switches SW1, SW2, and SW3 are capable of processing signals transitioning between the ground and the first logic high level VDDL.

Switch SW1 selectively couples an input node DIN1 with an internal node S responsive to a clock signal CLK1. Switch SW2 selectively couples another input node DIN2 with the internal node S responsive to another clock signal CLK2. Switch SW3 selectively couples an output node Q_LOW with the internal node S responsive to another clock signal CLK3. In some embodiments, only one of clock signals CLK1, CLK2, and CLK3 is set to have a high logic level at a time. In some embodiments, clock signals CLK1, CLK2, and CLK3 transition between the ground and the first logic high level VDDL. In some embodiments, clock signals CLK1, CLK2, and CLK3 transition between the ground and a third high logic level between VDDA and VDDL.

Inverter INV1 includes P-type transistors MP1 and MP2 and N-type transistors MN1 and MN2. Transistor MP1 has a source coupled to a power node configured to receive a voltage level substantially the same as the second logic high level VDDA. Transistor MP1 has a drain coupled to a source of transistor MP2. Transistor MN1 has a source coupled to a ground node configured to receive a voltage level as the ground of circuit 300. Transistor MN1 has a drain coupled to a source of transistor MN2. Drains of transistors MP2 and MN2 are coupled with each other and used as an output node Q_HIGH. In some embodiments, node Q_HIGH carries a high-swing signal transitioning between the ground and VDDA.

Inverter INV2 includes P-type transistors MP3 and MP4 and N-type transistors MN3 and MN4. Transistor MP3 has a source coupled to the power node and a drain coupled to a source of transistor MP4. Transistor MN3 has a source coupled to the ground node and a drain coupled to a source of transistor MN4. Drains of transistors MP4 and MN4 are coupled with each other.

Inverter INV3 has an input node coupled to the internal node S and an output node coupled to a gate of transistor MN1. Inverter INV4 has an input node coupled to the drain of transistor MN3 and an output node coupled to output node Q_LOW and switch SW3. Output node Q_LOW carries a low-swing signal transitioning between the ground and VDDL.

When switches SW1 and SW2 are turned off and switch SW3 is turned on, a gate of transistor MN1 receives a signal having a logic state substantially the same as that at the drain of transistor MN3 through inverters INV4, switch SW3, and inverter INV3. Also, a gate of transistor MN3 receives a signal having a logic state substantially the same as that at the drain of transistor MN1 through the cross-coupled transistors MP1 and MP3, inverter INV4, and switch SW3. Therefore, transistors MN1 and MN3 are effectively cross-coupled to form a positive feedback loop therebetween, and inverters INV1 and INV2 are configured to regain a logic state at output nodes Q_HIGH and Q_LOW.

When one of the switches SW1 and SW2 is turned on and switch SW3 is turned off, a gate of transistor MN1 receives a signal having a logic state substantially opposite that at internal node S and transistor MN3 receives a signal having a logic state substantially the same as that at internal node S. Thus, inverters INV1 and INV2 are configured to set output nodes Q_HIGH and Q_LOW to have a logic state the same as that at internal node S.

Transistors MP2 and MP4 and transistors MN2 and MN4 are biased to function as active loads between drains of transistors MP1 and MN1 in inverter INV1 and between drains of transistors MP3 and MN3 in inverter INV2. Transistors MP2 and MP4 and transistors MN2 and MN4 reduces the voltage differences observed by each transistor MP1 to MP4 and MN1 to MN4. As a result, a risk of causing transistors MP1 to MP4 and MN1 to MN4 to break down due to excessive voltage differences is reduced. Gates of transistors MP2 and MP4 are coupled to node VBIAS1, and gates of transistors MN2 and MN4 are coupled to node VBIAS2. In some embodiments, the voltage levels at node VBIAS1 and/or node VBIAS2 are set to cause transistors MP2 and MP4 and transistors MN2 and MN4 having different pull-up and dull-down driving capabilities. As a result, a duty cycle of the output signal at node Q_HIGH is thus adjusted accordingly. In some embodiments, node VBIAS1 is configured to be set at a voltage level substantially the same as the first logic high level VDDL. In some embodiments, node VBIAS2 is configured to be set at a voltage level substantially the same as the first logic high level VDDL.

Figure 4:
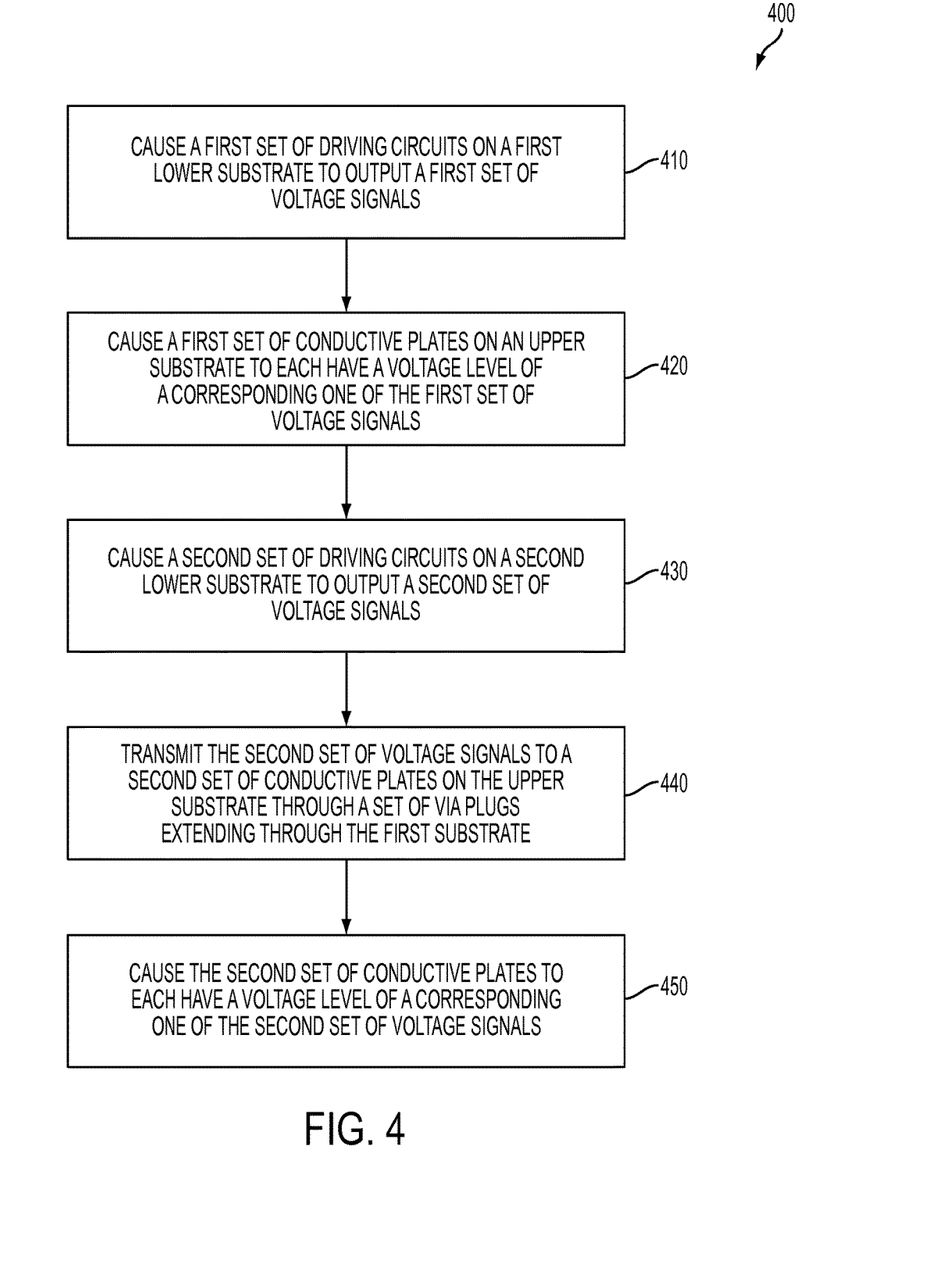
FIG. 4 is a flow chart of a method of operating a pattern generator in accordance with one or more embodiments.

FIG. 4 is a flow chart of a method 400 of operating a pattern generator in accordance with one or more embodiments. It is understood that additional operations may be performed before, during, and/or after the method 400 depicted in FIG. 4, and that some other processes may only be briefly described herein.

As depicted in FIG. 4 and FIG. 2, in operation 410, a first set of driving circuits 228 of the pattern generator 200 is caused to output a first set of voltage signals in response to a first set of input data. The first set of driving circuits 228 is on a lower substrate 222 of the pattern generator 210. Then, in operation 420, a first set of conductive plates 214d is caused to each have a voltage level of a corresponding one of the first set of voltage signals. The first set of conductive plates 214d being on an upper substrate 212 stacked over the lower substrate 222.

In operation 430, a second set of driving circuits 238 of the pattern generator 200 is caused to output a second set of voltage signals in response to a second set of input data. The second set of driving circuits 238 is on another lower substrate 232 of the pattern generator 200. The lower substrate 222 is stacked over the lower substrate 232. In operation 440, the second set of voltage signals is transited to a second set of conductive plates 214c on the upper substrate 212 through a set of via plugs 226c extending through the lower substrate 222. Then, in operation 450, the second set of conductive plates 214c is caused to each have a voltage level of a corresponding one of the second set of voltage signals.

In some embodiments, operations 420-430 and/or 440-450 are repeated for other lower chips 240 and 250 until all conductive plates 214a to 214d of pattern generator are set to have predetermined voltage levels according to input data. In some embodiments, because lower chip 220 is configured to accommodate all driving circuits, and thus lower chips 230, 240, and 250 and operations 440 and 450 are omitted.

In accordance with one embodiment, a pattern generator includes and upper chip and one or more lower chips. The upper chip includes an upper substrate and a plurality of conductive plates on the upper substrate. The plurality of conductive plates is arranged as an array. The one or more lower chips include one or more lower substrates and a plurality of driving circuits each on one of the one or more lower substrates and electrically coupled with a corresponding one of the plurality of conductive plates. The upper chip and the one or more lower chips are stacked one over another.

In accordance with another embodiment, a manufacture includes a first substrate, a plurality of conductive plates on an upper surface of the first substrate, and a first set of via plugs extending through the first substrate. The plurality of conductive plates is arranged as an array. Each via plug of the first set of via plugs is electrically coupled to a corresponding one of the plurality of conductive plates.

In accordance with another embodiment, a method of operating a pattern generator includes causing a first set of driving circuits of the pattern generator to output a first set of voltage signals in response to a first set of input data. The first set of driving circuits is on a first lower substrate of the pattern generator. A first set of conductive plates is on an upper substrate stacked over the first lower substrate. The first set of conductive plates is caused to each have a voltage level of a corresponding one of the first set of voltage signals.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pattern generator, comprising:
a lower chip having a plurality of conductive plate driving circuits, arranged in a first array having a first threshold pitch along a first direction, configured to generate a corresponding plurality of reflectivity-control signals; and
an upper chip stacked over the lower chip and having a plurality of conductive plates thereon arranged in a second array having a second threshold pitch along the first direction, wherein the first threshold pitch is greater than the second threshold pitch, each conductive plate having an adjustable electron-beam-reflectivity which is adjustable according to a corresponding one of the plurality of reflectivity-control signals, the upper chip having a conductive line electrically coupled to a conductive plate of the plurality of conductive plates and a via plug electrically coupled to a conductive plate driving circuit of the plurality of conductive plate driving circuits;
wherein a distribution of varying intensities of an electron beam (e-beam) reflectable off the corresponding plurality of conductive plates, taken as a whole, represents an e-beam-pattern generatable by the pattern generator.

2. The pattern generator of claim 1 wherein the adjustable electron-beam-reflectivity of each one of the plurality of conductive plates is adjustable based on a voltage level of the corresponding one of the plurality of reflectivity-control signals.

3. The pattern generator of claim 2 wherein the adjustable electron-beam-reflectivity of each one of the plurality of conductive plates is such that as the voltage levels of the corresponding one of the plurality of reflectivity-control signals decrease the electron-beam-reflectivity increases.

4. The pattern generator of claim 1 further comprising a plurality of stacked lower chips, including the lower chip, wherein each one of the plurality of stacked lower chips includes a respective array of conductive plate driving circuits.

5. The pattern generator of claim 1 wherein the first threshold pitch is M times the second threshold pitch.

6. A pattern generator, comprising:
at least one lower chip;
an upper chip stacked over the at least one lower chip;
a plurality of conductive plates on the upper chip, each of the plurality of conductive plates having an adjustable electron-beam-reflectivity against an electron beam, the electron-beam-reflectivity being adjustable according to a corresponding one of a plurality of reflectivity-control signals, wherein the plurality of conductive plates is associated with a first threshold pitch along a first direction; and
a plurality of conductive plate driving circuits configured to generate the corresponding plurality of reflectivity-control signals, each one of the plurality of conductive plate driving circuits being located on the at least one lower chip and electrically coupled to a respective conductive plate of the plurality of conductive plates, wherein the plurality of conductive plate driving circuits is associated with a second threshold pitch along the first direction, and the second threshold pitch is greater than the first threshold pitch;

wherein a distribution of varying intensities of an electron beam (e-beam) reflectable off the corresponding plurality of conductive plates, taken as a whole, represents an e-beam-pattern generatable by the pattern generator.

7. The pattern generator of claim 6 wherein the at least one lower chip comprises at least a fourth lower chip, a third lower chip stacked over the fourth lower chip, a second lower chip stacked over the third lower chip, and a first lower chip stacked between the upper chip and the second lower chip, the pattern generator further comprising:
a first conductive plate driving circuit on the first lower chip;
a second conductive plate driving circuit on the second lower chip;
a third conductive plate driving circuit on the third lower chip; and
a fourth conductive plate driving circuit on the fourth lower chip,
wherein the plurality of conductive plate driving circuits includes the first, second, third, and fourth conductive plate driving circuits.

8. The pattern generator of claim 7 further comprising:
a first array of conductive plate driving circuits, including the first conductive plate driving circuit, on the first lower chip;
a second array of conductive plate driving circuits, including the second conductive plate driving circuit, on the second lower chip;
a third array of conductive plate driving circuits, including the third conductive plate driving circuit, on the third lower chip; and
a fourth array of conductive plate driving circuits, including the fourth conductive plate driving circuit, on the fourth lower chip.

9. The pattern generator of claim 8 wherein the plurality of conductive plates is arranged in an array on the upper chip and electrically coupled to each of the first, second, third, and fourth arrays of conductive plate driving circuits.

10. The pattern generator of claim 6 further comprising an upper substrate of the upper chip stacked over a lower substrate of the upper chip, the upper substrate having conductive lines, the lower substrate having via plugs coupled to the conductive lines of the upper substrate.

11. A pattern generator, comprising:
an upper chip, comprising:
an upper substrate; and
a plurality of conductive plates on the upper substrate, the plurality of conductive plates being arranged as an array, wherein the plurality of conductive plates is associated with a first threshold pitch along a first direction, each conductive plate having an adjustable electron-beam-reflectivity which is adjustable according to a corresponding one of a plurality of reflectivity-control signals; and
one or more lower chips, comprising:
one or more lower substrates; and
a plurality of driving circuits configured to generate the corresponding plurality of reflectivity-control signals, each of the plurality of driving circuits being located on a corresponding one of the one or more lower substrates and electrically coupled with a corresponding one of the plurality of conductive plates, wherein the plurality of driving circuits is associated with a second threshold pitch along the first direction, and the second threshold pitch is greater than the first threshold pitch, the upper chip and the one or more lower chips being stacked one over another;
wherein a distribution of varying intensities of an electron beam (e-beam) reflectable off the corresponding plurality of conductive plates, taken as a whole, represents an e-beam-pattern generatable by the pattern generator.

12. The pattern generator of claim 11, wherein each of the one or more lower substrates has a first area insufficient to accommodate all of the plurality of driving circuits.

13. The pattern generator of claim 11, wherein each of the one or more lower substrates has a first area, and the upper substrate has a second area substantially the same as the first area.

14. The pattern generator of claim 11, wherein the second threshold pitch is about M times of the first threshold pitch, M is a positive integer, and the one or more lower chips comprises at least M chips.

15. The pattern generator of claim 14, wherein
the plurality of conductive plates has a third threshold pitch along a second direction perpendicular to the first direction;
the plurality of driving circuits are also arranged according to a fourth threshold pitch along the second direction, and the fourth threshold pitch is about N times of the third threshold pitch, N is a positive integer; and
the one or more lower chips comprises at least M×N chips.

16. The pattern generator of claim 11, wherein each of the one or more lower chips has about the same number of driving circuits of the plurality of driving circuits.

17. The pattern generator of claim 11, wherein the upper chip further comprises a plurality of via plugs extending through the upper substrate, and each via plug of the plurality of via plugs is electrically coupled to a corresponding one of the plurality of conductive plates.

18. The pattern generator of claim 11, wherein
the one or more lower chips comprises a first lower chip and a second lower chip, the first lower chip is between the upper chip and the second lower chip;
the first lower chip comprises:
a first sub-set of the plurality of driving circuits electrically coupled to a first sub-set of the plurality of conductive plates of the upper chip; and
a via plug extending through a lower substrate of the first lower chip and electrically coupled to a second sub-set of the plurality of conductive plates of the upper chip; and
the second lower chip comprises:
a second sub-set of the plurality of driving circuits electrically coupled to the second sub-set of the plurality of conductive plates of the upper chip through the via plug of the first lower chip.

19. The pattern generator of claim 11, wherein each of the plurality of driving circuits comprises a flip-flop circuit.

20. The pattern generator of claim 11, wherein the first threshold pitch ranges from 10 nm to 1 µm.

* * * * *